(12) United States Patent
Jagasivmani et al.

(10) Patent No.: US 8,301,977 B2
(45) Date of Patent: Oct. 30, 2012

(54) ACCELERATING PHASE CHANGE MEMORY WRITES

(75) Inventors: Meenatchi Jagasivmani, Folsom, CA (US); Anthony Ko, Richmond (CA); Rich E. Fackenthal, Carmichael, CA (US); Ferdinando Bedeschi, Biassono (IT); Enzo Donze, S. Giuseppe Jato (IT); Ravi Gutala, San Jose, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 975 days.

(21) Appl. No.: 12/346,697

(22) Filed: Dec. 30, 2008

(65) Prior Publication Data

US 2010/0169740 A1 Jul. 1, 2010

(51) Int. Cl.
*G11C 29/00* (2006.01)
(52) U.S. Cl. ........................................................ 714/763
(58) Field of Classification Search ........................ None
See application file for complete search history.

(56) References Cited

U.S. PATENT DOCUMENTS

| | | | |
|---|---|---|---|
| 2003/0191888 A1* | 10/2003 | Klein | 711/105 |
| 2005/0141261 A1* | 6/2005 | Ahn | 365/148 |
| 2005/0195633 A1* | 9/2005 | Choi et al. | 365/148 |
| 2006/0181932 A1* | 8/2006 | Cho et al. | 365/185.23 |
| 2007/0133267 A1* | 6/2007 | Cho et al. | 365/163 |
| 2008/0094915 A1* | 4/2008 | Fasoli | 365/185.25 |
| 2008/0180990 A1 | 7/2008 | Lung | |
| 2009/0122593 A1* | 5/2009 | Cho et al. | 365/148 |
| 2010/0091559 A1* | 4/2010 | Parkinson | 365/163 |

* cited by examiner

*Primary Examiner* — Gabriel Chu
(74) *Attorney, Agent, or Firm* — Seed IP Law Group PLLC (57) ABSTRACT

In a phase change memory, the memory array may be written in relatively small chunks. The writing of data to the array and, particularly, the writing of set data, may be accelerated using a hardware accelerator. The hardware accelerator may include an edge detector which detects a short duration signal pulse to trigger the writing of the set data to a cell. As a result, the writing of data may be accelerated, reducing the time to write in some cases.

28 Claims, 5 Drawing Sheets

ACCELERATING PHASE CHANGE MEMORY WRITES

BACKGROUND

1. Technical Field

This relates generally to phase change memory devices.

2. Description of the Related Art

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

Program performance is one of the key features of phase change memories. Buffer programming allows writing multiple data bytes (e.g. 64) at a time. In practice, buffered programming operations try to improve the programming performance by spreading the overhead time (e.g. for setup) over the entire buffer program time. Programming algorithms are normally implemented in assembly language, using an on-board code-execution processor and appropriate code portions.

However, a certain delay is inherent in executing the software for writing data. This delay arises because of the lines of code used, although in some cases relatively large groups of cells may be written at a time. Thus, several writing operations are repeatedly carried out to program an array of substantial size and increment of address and sequencing of the control signals can anyway incur a lot of overhead to the programming operation.

BRIEF SUMMARY

DETAILED DESCRIPTION

Figure 1:
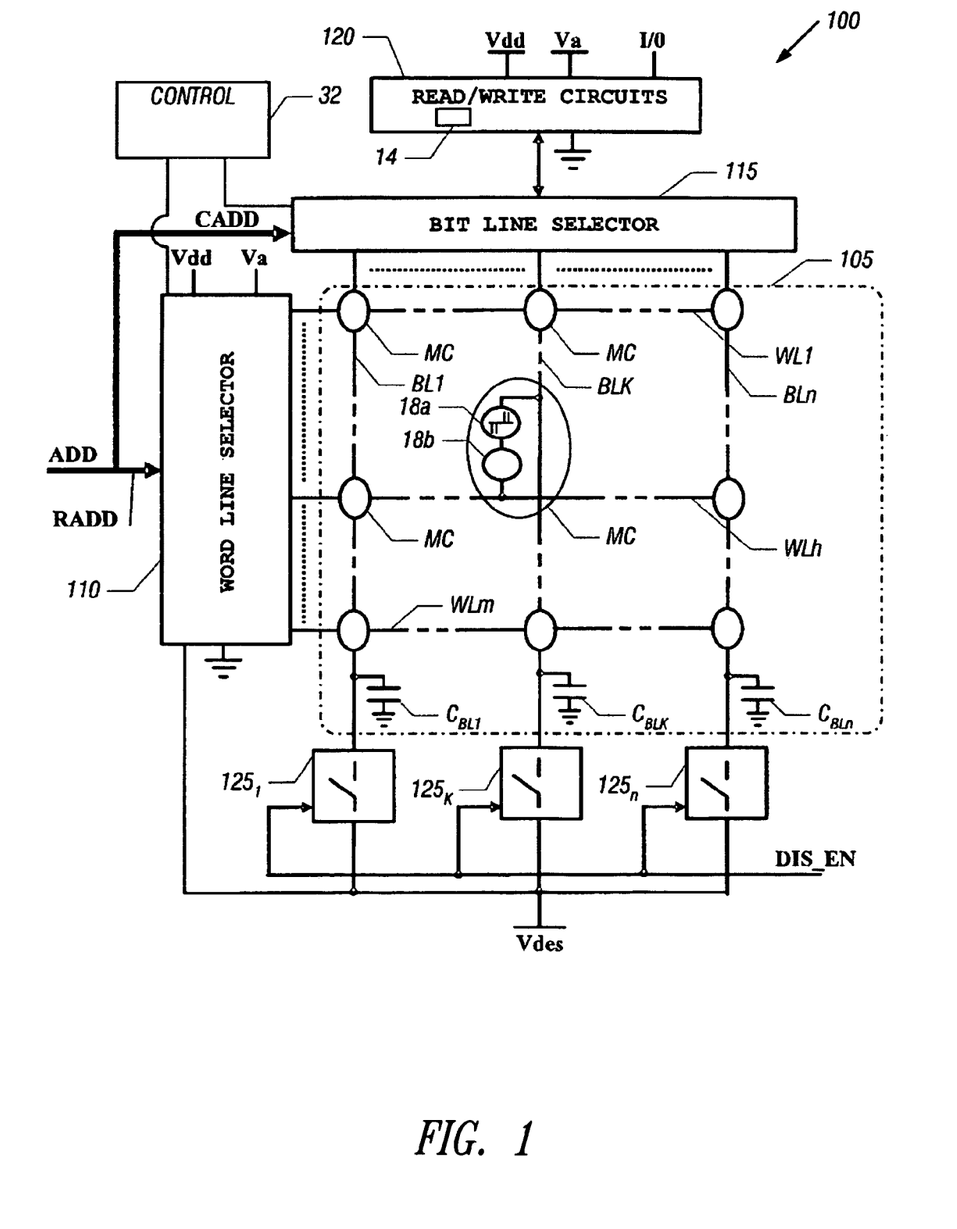
FIG. 1 is a schematic depiction of one embodiment of the present invention.

Referring to FIG. 1, a memory 100 includes an array of memory cells MC arranged in rows WL and columns BL in accordance with one embodiment of the present invention. While a relatively small array is illustrated, the present invention is in no way limited to any particular size of an array. Also, the memory 100 may use single or multi-level memory cells MC. While the terms "rows," "word lines," "bit lines," and "columns" are used herein, they are merely meant to be illustrative and are not limiting with respect to the type and style of the sensed array.

The memory device 100 includes a plurality of memory cells MC typically arranged in an array 105. The memory cells MC in the array 105 are arranged in m rows and n columns with a word line WL1-WLm associated with each array row, and a bit line BL1-BLn associated with each array column.

The memory device 100, in one embodiment, also includes a number of auxiliary lines including a supply voltage line Vdd, that provides a supply voltage Vdd through a chip including the memory device 100, and a ground voltage line GND, that distributes a ground voltage. Depending on the specific memory device embodiment, the supply voltage Vdd may be, typically, from 1 to 3 V, for example 1.8 V. A high voltage supply line Va provides a relatively high voltage, generated by devices (e.g. charge-pump voltage boosters not shown in the drawing) integrated on the same chip, or externally supplied to the memory device 100. For example, the high voltage Va may be 4.5-5 V in one embodiment.

The cell MC may be any memory cell including a phase change memory cell. Examples of phase change memory cells include those using a chalcogenide memory element 18a and an access, select, or threshold device 18b coupled in series to the device 18a. The threshold device 18b may be an ovonic threshold switch made of a chalcogenide alloy that does not exhibit an amorphous to crystalline phase change and which undergoes a rapid, electric field initiated change in electrical conductivity persisting only so long as a holding voltage is present.

A memory cell MC in the array 105 is connected to a respective one of the word lines WL1-WLm and a respective one of the bit lines BL1-BLn. In particular, the storage element 18a has a first terminal connected to the respective bit line BL1-BLn and a second terminal connected to a first terminal of the associated device 18b. The device 18b has a second terminal connected to a word line WL1-WLm. Alternatively, the storage element 18a may be connected to the respective word line WL1-WLm and the device 18b, associated with the storage element 18a, may be connected to the respective bit line BL1-BLn.

A memory cell MC within the array 105 is accessed by selecting the corresponding row and column pair, i.e. by selecting the corresponding word line and bit line pair. Word line selector circuits 110 and bit line selector circuits 115 perform the selection of the word lines and of the bit lines on the basis of a row address binary code RADD and a column address binary code CADD, respectively, part of a memory address binary code ADD, for example received by the memory device 100 from a device external to the memory (e.g., a microprocessor). The word line selector circuits 110 decode the row address code RADD and select a corresponding one of the word lines WL1-WLm, identified by the specific row address code RADD received. The bit line selector circuits 115 decode the column address code CADD and select a corresponding bit line or, more generally, a corresponding bit line packet of the bit lines BL1-BLn. For example, the number of selected bit lines depends on the number of data words that can be read during a burst reading operation on the memory device 100. A bit line BL1-BLn is identified by the received specific column address code CADD.

The bit line selector circuits 115 interface with read/write circuits 120. The read/write circuits 120 enable the writing of desired logic values into the selected memory cells MC, and reading of the logic values currently stored therein. For example, the read/write circuits 120 include sense amplifiers together with comparators, reference current/voltage generators, and current pulse generators for writing and reading the logic values stored in the memory cells MC.

In one embodiment, in a stand-by operating condition, as well as before any read or write access to the memory device 100, the word line selection circuits 110 keep the word lines WL1-WLm at a relatively high de-selection voltage Vdes (e.g., a voltage roughly equal to half the high voltage Va (Va/2)). At the same time, the bit line selector circuits 115 keep the bit lines BL1-BLn disconnected, and thus isolated, from the read/write circuits 120 or, alternatively, at the relatively low de-selection voltage Vdes. In this way, none of the memory cells MC is accessed, since the bit lines BL1-BLn are floating or a voltage approximately equal to zero is dropped across the access elements 18b, so the deselected row and column lines are at about the same voltage. Spare (redundant) rows and columns may be provided and used with a selection means to replace bad rows, bits, and columns by techniques familiar to those skilled in the art.

During a reading or a writing operation, the word line selection circuits 110 lower (or raise if an MOS transistor select device is used) the voltage of a selected one of the word lines WL1-WLm to a word line selection voltage VWL (for example, having a value equal to 0V—the ground potential if a bipolar diode or a chalcogenide select device, such as an ovonic threshold switch, is used), while the remaining word lines are kept at the word line de-selection voltage Vdes in one embodiment. Similarly, the bit line selector circuits 115 couple a selected one of the bit lines BL1-BLn (more typically, a selected bit line packet) to the read/write circuits 120, while the remaining, non-selected bit lines are left floating or held at the de-selection voltage, Vdes. Typically, when the memory device 100 is accessed, the read/write circuits 120 force a suitable current pulse into each selected bit line BL1-BLn. The pulse amplitude depends on the reading or writing operations to be performed.

In particular, during a reading operation a relatively low current pulse (compared to write current pulse magnitude) is applied to each selected bit line in one embodiment. The read current pulse has suitable amplitude and time duration. The read current causes the charging of stray capacitances $C_{BL1}$-$C_{BLn}$ (typically, of about 1 pF), intrinsically associated with the parasitic bit lines BL1-BLn and column drive circuitry, and, accordingly, a corresponding transient of a bit line voltage VBL at each selected bit line BL1-BLn. When the read current is forced into each selected bit line BL1-BLn, the respective bit line voltage raises towards a corresponding steady-state value, depending on the resistance of the storage element 18a, i.e., on the logic value stored in the selected memory cell MC. The duration of the transient depends on the state of the storage element 18a. If the storage element 18a is in the crystalline state and the threshold device 18b is switched on, a cell current flowing through the selected memory cell MC when the column is forced to a voltage has an amplitude lower than the amplitude in the case where the storage element 18a is in the higher resistivity or reset state, and the resulting voltage on the column line when a constant current is forced is lower for a set state relative to reset state.

The logic value stored in the memory cell MC may, in one embodiment, be evaluated through a comparison of the bit line voltage (or another voltage related to the bit line voltage) at, or close to, the steady state thereof with a suitable reference voltage, for example, obtained exploiting a service reference memory cell in an intermediate state or its equivalent. The reference voltage can, for example, be chosen to be an intermediate value between the bit line voltage when a logic value "0" is stored and the bit line voltage when a logic value "1" is stored.

In order to avoid spurious reading of the memory cells MC or to properly terminate the write cycle, the bit line stray capacitances $C_{BL1}$-$C_{BLn}$ may be discharged before performing a read operation. To this purpose, bit line discharge circuits $125_1$-$125_n$ are provided, associated with the bit lines BL1-BLn. The bit line discharge circuits $125_1$-$125_n$ are enabled in a bit line discharge phase of the memory device operation, preceding and after any operation, for discharging the bit line stray capacitances $C_{BL1}$-$C_{BLn}$, in one embodiment.

The bit line discharge circuits $125_1$-$125_n$ may be implemented by transistors, particularly N-channel MOSFETs having a drain terminal connected to the corresponding bit line BL1-BLn, a source terminal connected to a de-selection voltage supply line Vdes providing the de-selection voltage Vdes and a gate terminal controlled by a discharge enable signal DIS_EN in one embodiment. Before starting a writing or a reading operation, the discharge enable signal DIS_EN is temporarily asserted to a sufficiently high positive voltage, so that all the discharge MOSFETs turn on and connect the bit lines BL1-BLn to the de-selection voltage supply line Vdes. The discharge currents that flow through the discharge transistors cause the discharge of the bit line stray capacitances $C_{BL1}$-$C_{BLn}$ for reaching the de-selection voltage Vdes. Then, before selecting the desired word line WL1-WLm, the discharge enable signal DIS_EN is de-asserted and the discharge MOSFETs turned off. Similarly, to minimize access delay, the selected row and column lines may be respectively precharged to an appropriate safe starting voltage for selection and read or write operation. For example, the row line are pre-charged to zero volts while the column is forced to a voltage slightly less than minimum threshold voltage of a threshold device, such as an ovonic threshold switch.

In one embodiment, the selection device 18b is formed of a non-programmable chalcogenide material. While an embodiment is illustrated in which the selection device 18b is positioned over the phase change memory element 18a, the opposite orientation may be used as well.

Conversely, the phase change memory element 18a is capable of assuming either a set or reset state, as explained in more detail hereinafter. The phase change memory element 18a includes an insulator, a phase change memory material, a top electrode, and a barrier film, in one embodiment of the present invention. A lower electrode is defined within the insulator in one embodiment.

In one embodiment, the phase change material is a phase change material suitable for non-volatile memory data storage. A phase change material is a material having electrical properties (e.g., resistance) that may be changed through the application of energy such as, for example, heat, light, voltage potential, or electrical current.

Examples of phase change materials include a chalcogenide material or an ovonic material. An ovonic material is a material that undergoes electronic or structural changes and acts as a semiconductor once subjected to application of a voltage potential, electrical current, light, heat, etc. A chalcogenide material is a material that includes at least one element from column VI of the periodic table or a material that includes one or more of the chalcogen elements, e.g., any of the elements of tellurium, sulfur, or selenium. Ovonic and chalcogenide materials are non-volatile memory materials that may be used to store information.

In one embodiment, the memory material is a chalcogenide element composition from the class of tellurium-germanium-antimony ($Te_xGe_ySb_z$) material or a GeSbTe alloy (such as x=2, y=2, z=5), although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material is adapted to be altered to a particular one of a number of resistance values within a range of resistance values to provide digital or analog storage of information.

Programming of the memory material to alter the state or phase of the material may be accomplished by applying voltage potentials to the word lines and bitlines or forcing a current of adequate amplitude to melt the material, thereby generating a voltage potential across the memory material. An electrical current flows through a portion of the memory material in response to the applied voltage potentials or current forced, and results in heating of the memory material.

This heating and subsequent cooling may alter the memory state or phase of the memory material. Altering the phase or state of the memory material alters an electrical characteristic of the memory material. For example, resistance of the material may be altered by altering the phase of the memory material. The memory material may also be referred to as a programmable resistive material or simply a programmable resistance material.

In one embodiment, a voltage potential difference of about 0.5 to 1.5 volts may be applied across a portion of the memory material by applying about 0 volts to a word line WL and about 0.5 to 1.5 volts to a bitline. A current flowing through the memory material in response to the applied voltage potentials results in heating the memory material. This heating and subsequent cooling alter the memory state or phase of the material.

In a "reset" state, the memory material is in an amorphous or semi-amorphous state and in a "set" state, the memory material is in a crystalline or semi-crystalline state in one embodiment. The resistance of the memory material in the amorphous or semi-amorphous state is greater than the resistance of the material in the crystalline or semi-crystalline state. The association of reset and set with amorphous and crystalline states, respectively, is a convention. Other conventions may be adopted.

Due to electrical current, the memory material may be heated to a relatively higher temperature to amorphisize memory material and "reset" memory material. Heating the volume or memory material to a relatively lower crystallization temperature may crystallize memory material and "set" memory material. Various resistances of memory material may be achieved to store more than one logical bit in one physical bit by varying the amount of current flow and duration through the volume of memory material. Alternatively, the bit may be written by tailoring the edge rate of the trailing edge of the programming current or voltage pulse, such as by using a trailing edge rate of less than 100 nsec to reset the bit or a trailing edge greater than 500 nsec to set the bit.

The information stored in memory material may be read by measuring the resistance of the memory material. As an example, a read current is provided to the memory material using opposed lines and a resulting read voltage across the memory material is compared against a reference voltage using, for example, a sense amplifier. The read voltage above the selection device is proportional to the resistance exhibited by the memory storage element.

In order to select a cell MC on a column and row, the selection device 18b for the selected cell MC at that location is operated. The selection device 18b activation allows current to flow through the memory element 18a in one embodiment of the present invention.

In a low voltage or low field regime A, the device 18b is off and exhibits very high resistance in one embodiment. The off resistance can, for example, range from 100 kΩ to greater than 10 GΩ at a bias of half the threshold voltage, such as about 0.4V. The device 18b remains in its off state until a threshold voltage $V_T$ or threshold current $I_T$ switches the device 18b to a highly conductive, low resistance selected on state. The voltage across the device 18b after turn on drops to a slightly lower voltage relative to V threshold, called the holding voltage $V_H$ plus the current forced times the dynamic resistance of the "on" selection device. In one embodiment, for example, the threshold voltage is on the order of 1.1 volts, the holding voltage is on the order of 0.9 volts, and the dynamic resistance is 500Ω.

After passing through the snapback region, in the on state, the device 18b voltage drop remains close to the holding voltage as the current passing through the device is increased up to a certain, relatively high, current level for writing or relatively low current for reading. Above that current level the device remains on but displays a finite differential resistance with the voltage drop increasing with increasing current. The device 18b remains on until the current through the device 18b is dropped below a characteristic holding current value that is dependent on the size and the material utilized to form the device 18b.

In one embodiment of the present invention, the selection device 18b does not change phase. It remains permanently amorphous and its current-voltage characteristics remains the same throughout its operating life.

As an example, for a 0.5 micrometer diameter device 18b formed of TeAsGeSSe having respective atomic percents of 16/13/15/1/55, the holding current may be on the order of 0.1 to 100 µA. Below this holding current, the device 18b turns off and returns to the high resistance regime at low voltage, low field. The threshold current for the device 18b is generally of the same order as the holding current and preferably greater than the holding current to avoid oscillations depending on read bias point. The holding current may be altered by changing process variables, such as the top and bottom electrode material and the chalcogenide material. The device 18b allows a relatively high "on current" for a given area of device and voltage across it compared to conventional access devices such as metal oxide semiconductor field effect transistors or bipolar junction transistors or diodes.

One technique for addressing the array 105 uses a voltage V applied to the unselected column and rows, with zero voltage applied to the selected row. For the case where the device 100 is a phase change memory, the voltage V is chosen to be greater than or equal to the minimum threshold voltage of the device 18b, but less than two times the minimum threshold voltage of the device 18b. In other words, the maximum threshold voltage of the device 18b, and the maximum holding voltage of device 18b plus the maximum reset threshold voltage of the device 18a may be less than 2V. All of the unselected rows and columns may be biased at V/2.

With this approach, there is no bias voltage between the unselected rows and unselected columns. This reduces and minimizes background and standby leakage current.

After biasing the array in this manner, the memory elements 18a may be programmed and read by whatever means is needed for the particular memory technology involved, the dynamic resistances of the select device 18b and memory 18a are low enough so that the memory is above to be written in less than 2V volts. A memory element 18a that uses a phase change material may be programmed by forcing the current needed for memory element phase change or the memory array can be read by forcing a lower current to determine the device 18a resistance.

For the case of a phase change memory element 18a, programming a given selected bit in the array 105 can be as follows. Unselected rows and columns are biased as described for addressing, such as at V. A zero voltage is applied to the selected row. A current is forced on the selected column with a voltage compliance that is greater than the maximum threshold voltage of the device 18b, and equal to the maximum holding voltage plus the maximum threshold voltage of the device 18a plus margin to allow write. The current amplitude, duration, and pulse shape are selected to place the memory element 18a in the desired phase and thus, the desired memory state. Preferably, the write pulse is terminated with a fast edge rate less than 10 nsec to write a reset bit (reset pulse) and a slow edge rate greater than 200 nsec to write a set bit (set pulse).

Reading a phase change memory element 18a can be performed as follows. Unselected rows and columns are biased as described previously at V. A zero voltage is applied to the selected row. A voltage is forced at a value greater than the maximum threshold voltage of the device 18b, but less than the minimum holding voltage of the device 18b plus the minimum threshold voltage of the element 18a on the selected column. The current compliance of this forced voltage is less than the current that could program or disturb the set phase of the memory element 18a. If the phase change memory element 18a is set, the access device 18b switches on and presents a low voltage, high current condition to a sense amplifier. If the device 18a is reset, a larger voltage, lower current condition may be presented to the sense amplifier. The sense amplifier can either compare the resulting column voltage to a reference voltage or compare the resulting column current to a reference current.

The above-described reading and programming protocols are merely examples of techniques that may be utilized. Other techniques may be utilized by those skilled in the art.

In some embodiments of the present invention, the control 32 is software operable. However, it may also be implemented in hardware or firmware. In a software mode, the control may be responsible, for example, for reading and writing data in the memory array 105. In some cases, a certain delay occurs in executing the software for writing data. This delay arises because of the lines of code used and the fact that, in many cases, only a relatively small group of cells may be written at a time. Thus, the writing is repeatedly implemented in order to program an array of substantial size.

Figure 2:
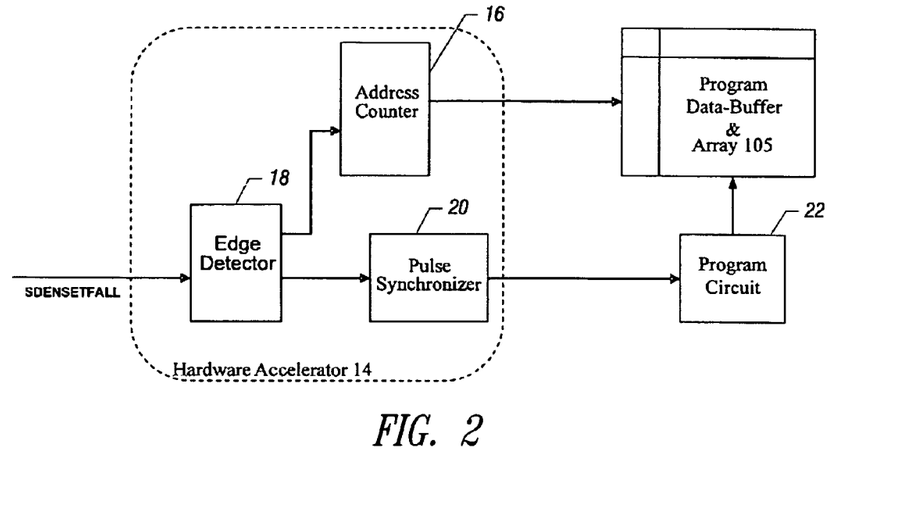
FIG. 2 is a flow chart of the operation of one embodiment of the present invention.

Thus, in one embodiment, shown in FIG. 2, the read/write circuits 120 include a hardware accelerator 14 for accelerating the writing of data to the memory array 105 using a program circuit 22. The program circuit 22 is an analog block that generates a SET current and a RESET current and includes a path that enables the program current to get to the cells of the memory array 105. The SET current is the current used to program one of the memory cells into the set state (crystalline) and the RESET current is the current used to program one of the memory cells into the reset state (amorphous). The RESET current is quenched quickly to 0 uA to obtain the reset state and the SET current is ramped down more slowly to 0 uA to obtain the set state. The program circuit 22 also produces a signal SDENSETFALL (hereinafter referred to as the fall signal) indicating that the SET current has fallen to 0 uA.

The hardware accelerator 14 comprises an edge detector 18, an address counter 16 and a pulse synchronizer 20, and receives the fall signal from the program circuit. The fall signal is detected by the edge detector 18 which provides an output, indicating that the edge has been detected, to the address counter 16 and the pulse synchronizer 20.

The pulse synchronizer 20 issues signals LDPPULSE, LDQUENCH, and LDSETSLOPE to the program circuit 22. The signal LDPPULSE is responsible for initiating the actual writing of data to the memory array 105 by the program circuit 22. When LDPPULSE=1, the path from the program current generator to the array is turned on, enabling the bit-cell to receive the program current (SET or RESET current). LDQUENCH and LDSETSLOPE control the timing of the currents. LDQUENCH is used to quench or quickly pull-down the RESET current to 0 uA—this causes the cell to end up in an amorphous, high resistance state. LDSETSLOPE is used to time the start of the SET current ramping down. Once LDSETSLOPE goes high, the program current generator block will slowly start ramping down the SET current to 0 uA. This slow ramp down of the program current causes the cell to end up in a more crystalline, lower resistance state.

As shown in FIG. 2, the address counter 16 sends an address to select the appropriate location for writing in both a data buffer and an array 105. The data buffer may be used to store data to be programmed. Of course, since the amount of data that can be programmed into the array in any instance of time is relatively small, the data buffer may function to hold the data pending storage in the array.

Figure 3:
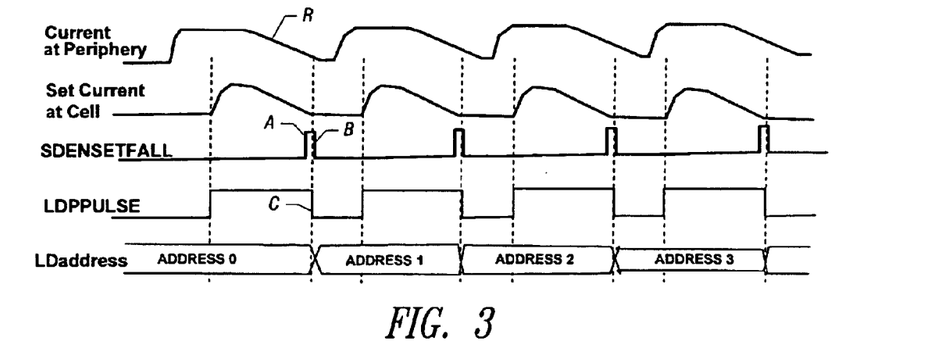
FIG. 3 is a schematic diagram for one embodiment of the present invention.

Referring to FIG. 3, a series of sample signals for the accelerator shown in FIG. 2 are provided. At the bottom, a series of addresses are indicated and the addresses correspond to the addresses that are provided by the address counter 16 to the data buffer and array 105. The LDPPULSE signal corresponds to the signal issued by the pulse synchronizer 20 in FIG. 2. The fall signal SDENSETFALL is the fall signal which the edge detector 18 detects. An example of a set current at a cell is provided. For simplicity, the reset current is not shown. The signal LDPPULSE indicates the window in which current can be applied to the cells in the array 105. A reference current is first generated in the periphery which is mirrored to the cell. Thus, the reference current at the periphery is the top waveform of FIG. 3.

In order to write, in one embodiment, the signal LDPPULSE is set to one by the pulse synchronizer 20. This triggers the set current to be applied to the cell, which current is indicated in the second waveform from the top in FIG. 3. In one embodiment, after a certain amount of time, the set current ramps down, as indicated at R, and triggers the fall signal to go high, as indicated at A in FIG. 3. This causes the edge detector 18 to pull LDPPULSE to low, as indicated at C.

The hardware accelerator 14 includes synchronized logic that reduces programming overhead by performing the address increment and control of programming control signals automatically. These operations may be done in parallel with program operation implemented by the control 32.

The address counter 16 automatically updates the address to be written. The edge detector 18 triggers when the set program current has ramped down (at R, for example) to signal completion of the pulse. Control of the sequence of program operation by setting or resetting the main programming signals, such as LDPPULSE, may be done by the pulse synchronizer 20.

While the current (LDPULSE=1) is being applied, the address is incremented to the next address. Then, when LDPULSE goes high, the next address is applied to the external bus (LD address) to allow for decoding circuits to select the next location of cells to be programmed.

Further to reducing time for usual programming operations, the hardware accelerator 14 also allows to provide the memory 100 with additional functions, that would be otherwise too time-consuming and could not be implemented. By way of example, refresh of altered PCM will be hereinafter described, with reference to FIGS. 4-7.

Most nonvolatile memories, including phase change memories, exploit error correcting codes (ECC) to recover possible errors that may result from alterations of the content of some cells. Errors are commonly understood as cells or bits that have or should have been programmed to one of the set or reset state, but do not result in the expected state because of faulty program operations or because of unexpected alterations. For example, ageing may affect cells, because storage elements in the crystalline state tend to become amorphous as a consequence of numerous reading cycles.

Thus, redundant bits are associated with each memory word and error correcting codes use the redundant bits to store a unique signature for every specific combination of bits in the memory word. When a memory location is read, the signature is newly calculated from the memory word and compared to the stored signature. If the content of one bit (or of at most a given number of bits, essentially according to the length of the signature) has changed, the comparison reveals one error (or more). A correction procedure is then run to locate the error(s) and to present corrected data to the user.

ECC may be used to recover alterations in phase change memories, by selectively modifying only bits where errors have been located (refresh). Selective corrections of bits is also possible due to the so called "bit-alterability" of phase change memories. In other word, the structure of phase change memories is such that every bit may be selected for programming separately and independently from any other bits, including bits of the same memory unit (page, that normally includes a plurality of words, e.g. 4). So, when a string is to be stored at a memory location, program pulses may be delivered selectively to bits that actually need to be modified and not to other bits (i.e. not to bits that are the same in the existing word and in the new word to be stored). Typically, the content of a memory location that must be programmed is read and compared bit-to-bit with the content of a register where the string to be programmed is temporarily stored. Then, only different bits are actually programmed.

Figure 4:
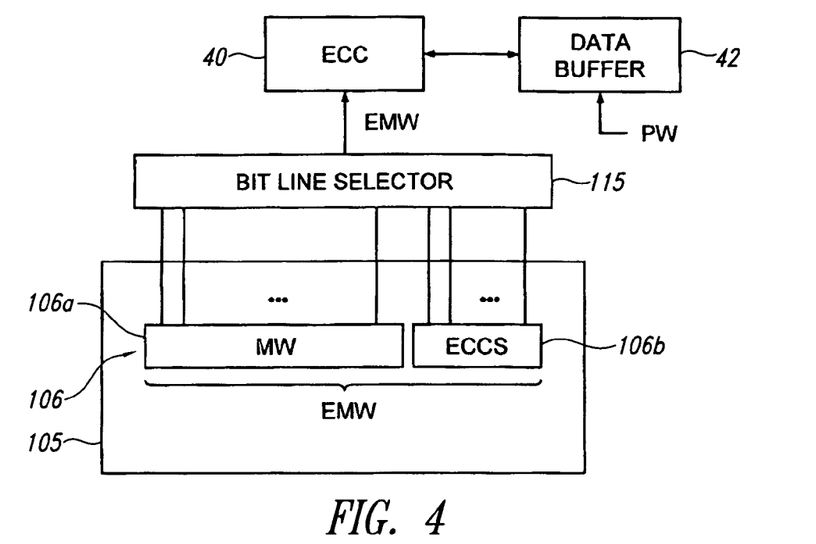
FIG. 4 is a schematic depiction of one embodiment of the present invention.

As illustrated in FIG. 4, the memory 100 comprises an ECC module 40 and a data buffer 42, that may be all incorporated in the read/write circuits 120 in one embodiment. FIG. 4 also shows a portion of the array 105 and a memory location 106 that includes a storage section 106a, where a memory word MW may be stored, and an ECC section 106b, for holding a correction signature ECCS calculated through an ECC algorithm from the memory word MW in the corresponding storage section 106a. The memory word MW and the corresponding correction signature ECCS form an extended memory word EMS.

The ECC module 40 may receive an extended memory word EMS from the memory array 105 through selection circuits, namely the bit line selector circuits 115. Upon receipt of an extended memory word EMS, the ECC module 40 applies an ECC procedure, that includes generating a new correction signature from the memory word MW of the received extended memory word EMS, comparing the new correction signature with the stored correction signature ECCS and, if the new correction signature and the stored correction signature ECCS do not match, locating and correcting an error (or errors). In case error correction is applied, the ECC module 40 sets a flag F to an error occurrence value EOV (e.g. high), to indicate that the extended memory word EMS contains an error.

Figure 5:
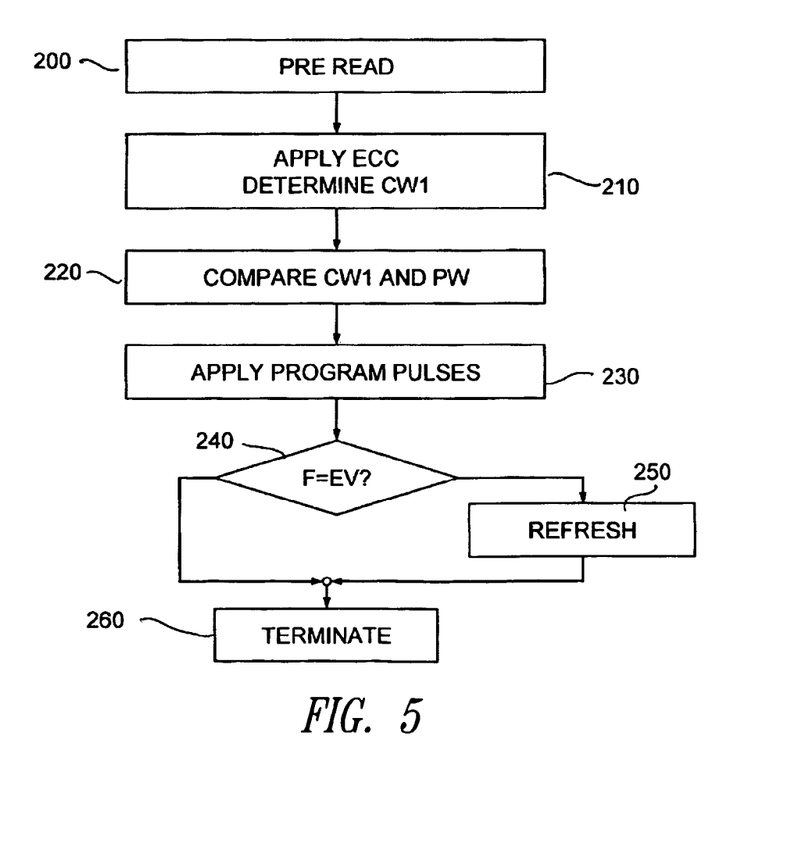
FIG. 5 is a flow chart of the operation of one embodiment of the present invention.

FIG. 5 illustrates a programming procedure carried out by the control 32 in one embodiment.

A memory location to be written is selected and preliminarily read (pre-read stage, block 200), whereby an extended memory word EMW stored in the selected memory location is obtained and supplied to the ECC module 40. The ECC module 40 applies the ECC procedure and determines a first corrected word CW1 from the memory word MW of the extended memory word EMW (block 210). If the received extended memory word EMW was already correct, the flag F is set to an error absence value EAV. If an error has been located and corrected, instead, the flag F is set to the error occurrence value EOV. Then, a section of the first corrected word CW1, corresponding to addresses to be programmed, is compared bit-to-bit to a program word PW to be stored in the selected location (block 220) and program pulses are selectively applied to discordant bits to be programmed (block 230). The program word PW may contain a memory word to be stored in the storage section 106a of a memory location 106 and a corresponding correction signature to be stored in the corresponding ECC section 106b.

The control 32 tests the flag F (block 240). If an error has been corrected during the ECC programming, the flag F is at the error occurrence value EOV. In this case (output YES from block 240), a refresh procedure is carried out (block 250), as explained hereinafter. Otherwise (output YES from block 240), the programming procedure is terminated (block 260).

Figure 6:
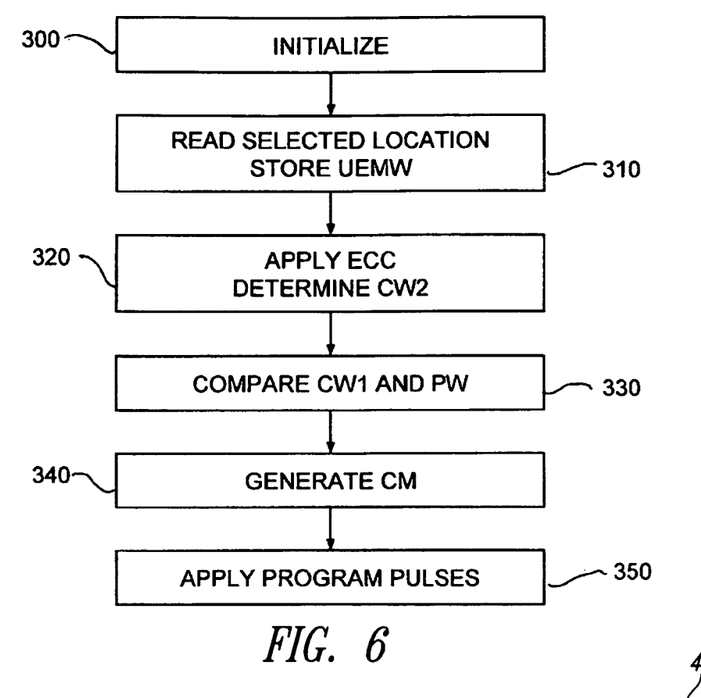
FIG. 6 is a flow chart of the operation of one embodiment of the present invention.

The refresh procedure carried out through the control 32 is illustrated in FIG. 6. After initialization (block 300), the selected memory location is read once again (block 310) and an uncorrected extended memory word UEMW thus obtained is temporarily stored in the data buffer 42 and also supplied to the ECC module 40 (see also FIG. 7). The uncorrected extended memory word UEMW includes an uncorrected memory word UMW and a corresponding uncorrected signature.

Figure 7:
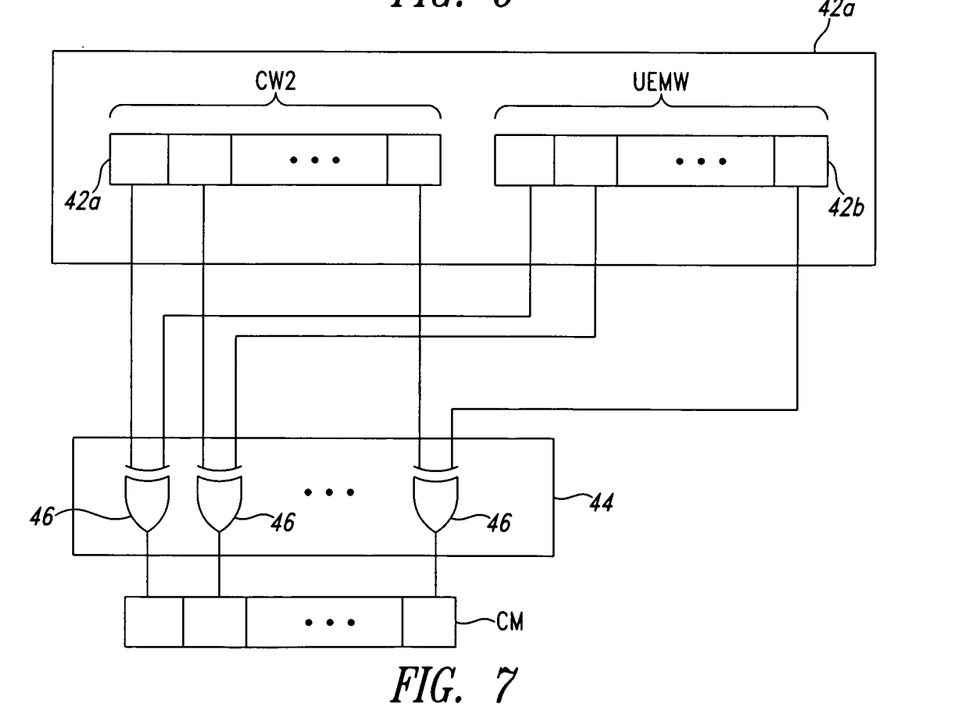
FIG. 7 is a more detailed flow chart of the operation of one embodiment of the present invention.

The ECC module 40 applies the ECC procedure to the uncorrected memory word UMW and determines a second corrected word CW2, that is loaded into the data buffer 42 as well (FIG. 6, block 320; FIG. 7) and includes a memory portion and the corresponding signature.

Possible errors are located by comparing bit-to-bit the second corrected word CW2 and the uncorrected extended memory word UEMW (block 330). A correction mask CM is thus generated by the comparison and includes correction values (e.g. high) at locations that correspond to bits to be corrected, if any (block 340).

The correction mask CM is used to program bits that require correction (block 350). More precisely, set program pulses are applied to bits that require correction and have been determined to be in the reset state (amorphous), while reset program pulses are applied to bits that require correction and have been determined to be in the set state (crystalline).

Bit-to-bit comparison may be accomplished e.g. through a comparator module 44 (FIG. 7), that includes as many exclusive logic gates 46 (XOR gates in one example) as the bits of an extended memory word EMW, e.g. N. The second corrected word CW2 and the uncorrected extended memory word UEMW are temporarily stored at respective locations 42a, 42b of the data buffer 42. Each bit of the locations 42a, 42b is coupled to an input of a respective exclusive logic gate 46, in such a manner that bits at corresponding positions of the locations 42a, 42b are coupled to respective inputs of the same exclusive logic gate 46. The outputs of the exclusive logic gates 46 determine values of corresponding bits of the correction mask CM.

Advantages of the described refresh procedure may be especially appreciated in case of single word programming, partial and misaligned programming and flash-emulation buffer programming. In some phase change memories, in fact, a page (of e.g. 4 words) is the least readable memory unit, i.e. the whole content of a selected page is read in a reading operation, although only some of the words of the page may be actually of interest. So, the pre-read stage of whatever programming cycle reads a whole memory page. When one of the mentioned programming modes is selected, however, only a portion of a memory page is to be programmed. In other words, a memory page contains other memory addresses further to those selected for programming. In single word programming, for example, only one word is affected by writing operations, while most of a memory page remains unchanged. Likewise, in any of the other mentioned programming modes a portion of a memory page is not actually involved in programming. Nevertheless, a whole page is read in the pre-read stage and then subjected to ECC procedure. So, an error in a memory page may be located whether or not it corresponds to a bit selected for programming, without any additional operations. Then, the refresh procedure may be used to correct errors at addresses of a memory page that are not involved in writing, but must anyway be read.

In another embodiment, the refresh procedure illustrated in FIG. 6 may be run after ordinary reading of the phase change memory 100, if errors have been corrected by the ECC module 40.

Figure 8:
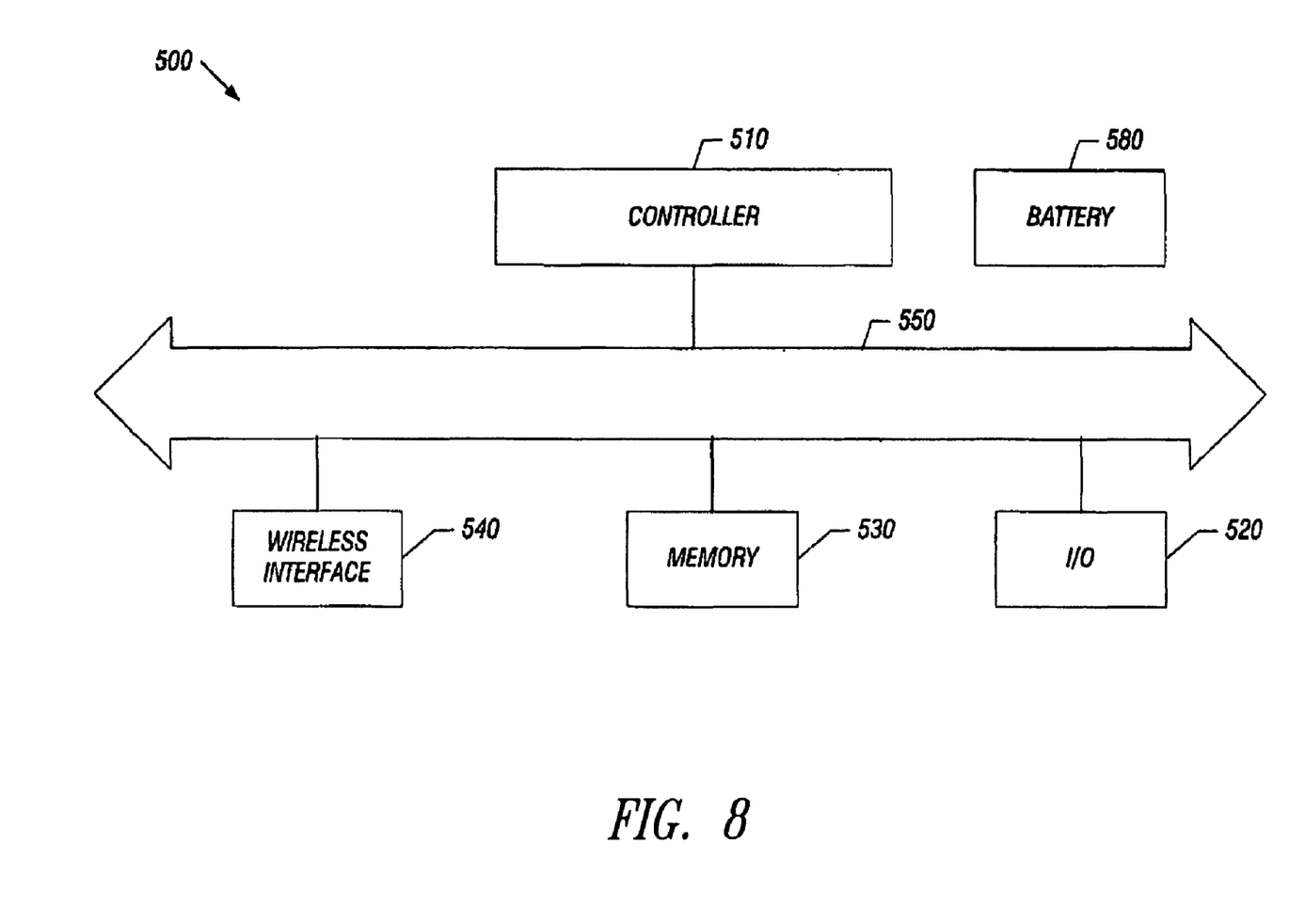
FIG. 8 is a system diagram for one embodiment of the present invention.

Turning to FIG. 8, a portion of a system 500 in accordance with an embodiment of the present invention is described. System 500 may be used in wireless devices such as, for example, a cellular telephone, personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540, coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or phase change memory that includes a memory element 18a such as, for example, memory 100 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
   writing to a phase change memory using a software control; and
   accelerating the writing to the phase change memory using a hardware accelerator, wherein using a hardware accelerator includes:
   detecting a reduction in set current; and
   generating an address to a phase change memory array of the phase change memory in response to the detection of the reduction of set current.

2. The method of claim 1 wherein detecting a change in set current includes causing a programming signal to change state in response to detecting said reduction of said set current.

3. The method of claim 1 including generating a programming signal having a first value configured to start a programming cycle and a second value configured to end the programming cycle in response to detecting said reduction in set current.

4. The method of claim 3 including using a falling edge of said programming signal to end the programming cycle and using a rising edge of said programming signal to start the programming cycle.

5. The method of claim 1, wherein generating the address includes using an address counter to automatically update the address to indicate a next memory location to be programmed.

6. The method of claim 1, including:
locating errors at bits of the phase change memory array, wherein locating errors includes reading a memory word from a memory location, using an error correction code to generate a correction signature for at least a portion of the memory word, generating a corrected word from the memory word and from the correction signature, and comparing the corrected word with the memory word; and
selectively modifying bits at which errors have been located.

7. A method comprising:
writing to a phase change memory using a software control;
accelerating the writing to the phase change memory using a hardware accelerator; and
locating errors at bits of the phase change memory array, wherein locating errors includes reading a memory word from a memory location, using an error correction code to generate a correction signature for at least a portion of the memory word, generating a corrected word from the memory word and from the correction signature and comparing the corrected word with the memory word.

8. The method of claim 7, comprising generating a correction mask from comparing the corrected word with the memory word.

9. The method of claim 7, wherein selectively modifying comprises applying program pulses selectively to the bits at which errors have been located.

10. A phase change memory comprising:
a memory array including phase change memory cells; and
a hardware accelerator configured to accelerate writing data to the phase change memory array, wherein said hardware accelerator includes:
a detector configured to detect a reduction in a set current and
an address generator configured to output an address of a next memory cell to be programmed in response receiving an indication from the detector indicating that the detector has detected the reduction in the set current.

11. The memory of claim 10, further comprising a program circuit configured to supply the set current to the memory array and configured to supply a fall signal indicating the reduction in the set current.

12. The memory of claim 11 wherein said detector is an edge detector configured to detect an edge of the fall signal indicating the reduction in the set current.

13. The memory of claim 11 wherein said hardware accelerator includes a pulse synchronizer configured to generate a programming signal and said detector is configured to cause the pulse synchronizer to change a state of the programming signal in response to detecting the reduction of the set current.

14. The memory of claim 13, wherein the pulse synchronizer is configured to set the programming signal at a first value to start a programming cycle and set the programming signal to a second value to end the programming cycle.

15. The memory of claim 14 wherein said pulse synchronizer is configured to use a falling edge of said programming signal to end the programming cycle and use a rising edge of said programming signal to start the programming cycle.

16. The memory of claim 10 wherein said address counter is configured to automatically update the address to be programmed in the memory array.

17. The memory of claim 10, comprising an error correction module configured to locate errors at bits of said memory array and a controller configured to selectively modify bits at which errors have been located, wherein said error correction module is configured to receive a memory word from a memory location, to use an error correction code to generate a correction signature for at least a portion of said memory word, to generate a corrected word from said memory word and from said correction signature, and to compare said corrected word with said memory word.

18. A phase change memory comprising:
a memory array including phase change memory cells;
a hardware accelerator configured to accelerate writing data to the phase change memory array;
an error correction module configured to locate errors at bits of said memory array; and
a controller configured to selectively modify bits at which errors have been located, wherein said error correction module is configured to receive a memory word from a memory location, to use an error correction code to generate a correction signature for at least a portion of said memory word, to generate a corrected word from said memory word and from said correction signature and to compare said corrected word with said memory word.

19. The method of claim 18, wherein the controller is configured to apply program pulses selectively to the bits at which errors have been located.

20. A system comprising:
a processor; and
a phase change memory coupled to said processor, said phase change memory including a memory array including phase change memory cells and a hardware accelerator to accelerate writing data to said phase change memory array, wherein said hardware accelerator includes:
a detector configured to detect a reduction in a set current and
an address generator configured to output an address of a next memory cell to be programmed in response receiving an indication from the detector indicating that the detector has detected the reduction in the set current.

21. The system of claim 20 wherein said hardware accelerator includes a program circuit configured to supply the set current to the memory array and configured to supply a fall signal indicating the reduction in the set current.

22. The system of claim 21 wherein said detector is an edge detector configured to detect an edge of the fall signal indicating the reduction in the set current.

23. The system of claim 21 wherein said hardware accelerator includes a pulse synchronizer configured to generate a programming signal and said detector is configured to cause the pulse synchronizer to change a state of the programming signal in response to detecting the reduction of the set current.

24. The system of claim 23, wherein the pulse synchronizer is configured to set the programming signal at a first value to start a programming cycle and set the programming signal to a second value to end the programming cycle.

25. The system of claim 24 wherein pulse synchronizer is configured to use a falling edge of said programming signal to end the programming cycle and use a rising edge of said programming signal to start the programming cycle.

26. The system of claim 20, wherein said phase change memory includes an error correction module configured to locate errors at bits of said memory array and a controller configured to selectively modify bits at which errors have been located, wherein said error correction module is configured to receive a memory word from a memory location, to use an error correction code to generate a correction signature for at least a portion of said memory word, to generate a corrected word from said memory word and from said correction signature, and to compare said corrected word with said memory word.

27. A system comprising:
  a processor; and
  a phase change memory coupled to said processor, said phase change memory including:
    a memory array including phase change memory cells;
    a hardware accelerator configured to accelerate writing data to the phase change memory array;
    an error correction module configured to locate errors at bits of said memory array; and
    a controller configured to selectively modify bits at which errors have been located, wherein the error correction module is configured to receive a memory word from a memory location, to use an error correction code to generate a correction signature for at least a portion of the memory word, to generate a corrected word from the memory word and from the correction signature, and to compare the corrected word with the memory word.

28. The method of claim 27, wherein the controller is configured to apply program pulses selectively to the bits at which errors have been located.

* * * * *